United States Patent [19]

Lasagna et al.

[11] Patent Number: 5,015,879
[45] Date of Patent: May 14, 1991

[54] CIRCUIT FOR PROCESSING THE SIGNAL GENERATED BY A VARIABLE-RELUCTANCE ELECTROMAGNETIC ROTATION SENSOR

[75] Inventors: Diego Lasagna, Chieri; Francesco Semeraro, Turin, both of Italy

[73] Assignee: Marelli Autronica S.p.A., Milan, Italy

[21] Appl. No.: 426,377

[22] Filed: Oct. 25, 1989

[30] Foreign Application Priority Data

Oct. 25, 1988 [IT] Italy .................... 67956 A/88

[51] Int. Cl.$^5$ ............................................ H03K 5/153
[52] U.S. Cl. ................................. 307/358; 307/309; 328/5
[58] Field of Search ............... 307/261, 350, 354, 358, 307/359, 309; 328/5, 108, 115.7

[56] References Cited

U.S. PATENT DOCUMENTS 4,169,232  9/1979  Henrich ......................... 307/358
4,635,142  1/1987  Haugland ....................... 307/358
4,866,298  9/1989  Kniss et al. ..................... 328/5

FOREIGN PATENT DOCUMENTS 0166699  1/1986  European Pat. Off. .

*Primary Examiner*—John Zazworsky
*Attorney, Agent, or Firm*—Sughrue, Mion, Zinn, Macpeak & Seas

[57] ABSTRACT

The circuit includes a threshold comparator which compares the signal provided by the sensor with that provided by a threshold-signal generator. The threshold-signal generator circuit comprises
- a peak-detector circuit connected to the sensor,
- a capacitor connected between the output of the peak-detector circuit and the threshold-signal input of the comparator, and
- a reset circuit controlled by the output of the threshold comparator so as to cause the capacitor to discharge every time the signal provided by the sensor exceeds the threshold signal.

3 Claims, 2 Drawing Sheets

CIRCUIT FOR PROCESSING THE SIGNAL GENERATED BY A VARIABLE-RELUCTANCE ELECTROMAGNETIC ROTATION SENSOR

DESCRIPTION

The present invention relates to a circuit for processing a signal generated by a variable-reluctance electromagnetic rotation sensor to provide a signal the sign of whose amplitude can change, in particular from positive to negative, passing through zero.

A variable-reluctance rotation sensor typically comprises a rotor which has a series of teeth or notches in suitable positions, and with which an inductive pick-up is associated. When the rotor is rotated, each time one of its teeth passes in front of the pick-up, the latter outputs a signal whose amplitude is first of all positive and then passes through zero and becomes negative.

Sensors of this type have various applications, in particular in the automotive field, for example for detecting the rate of rotation of a drive shaft or for detecting the instant at which a piston of the engine passes through top or bottom dead centre. In these applications, it is important to be able to determine correctly the instant at which the signal provided by the sensor passes through zero. The circuits used for this purpose typically comprise:

a threshold-signal generator circuit, and a threshold comparator circuit with hysteresis which is intended to be connected to the sensor and to the threshold-signal generator circuit and to output a signal which changes from a first level to a second level when the signal generated by the sensor exceeds the threshold signal, and which changes from the second level to the first level when the signal generated by the sensor passes through zero.

A circuit of this type is described, for example, in the Applicant's published European patent application No. 166699.

The signal generated by a variable-reluctance rotation sensor has a frequency which is proportional to the angular velocity of the rotor. Moreover, as is well known, the amplitude of the signal varies greatly with variations in frequency and, in particular, increases non-linearly as the frequency increases. In some circuits for processing the signal output by this type of sensor, the threshold-signal generator circuit is arranged correspondingly to provide a signal whose amplitude varies dynamically as the frequency of the sensor signal varies and, in particular, which increases as this frequency increases.

In such known circuits, the amplitude of the threshold signal cannot vary sufficiently quickly particularly for high frequencies of the sensor signal. Thus, for example, when the sensor signal has a low peak value immediately following a higher peak value, the slowness with which the amplitude of the threshold signal adjust may result in a failure to detect the low-value peak.

The object of the present invention is to produce a circuit for processing signals generated by a sensor of the aforesaid type, which avoids the disadvantage of the known circuits described above.

According to the invention, this object is achieved by means of a circuit of the type specified above, whose main characteristic lies in the fact that the threshold-signal generator circuit comprises a peak-detector circuit which is intended to be connected to the sensor, storage means connected to the output of the peak-detector circuit and to the threshold-signal input of the comparator, and circuit means for resetting the storage means which are controlled by the output of the threshold comparator so as to zero the storage means almost instantaneously each time the signal provided by the sensor exceeds the threshold signal.

In one embodiment of the circuit according to the invention the storage means comprise a capacitor and the reset means include a switch connected to the capacitor and controlled by a monostable circuit which is controlled by the output of the threshold-comparator circuit.

Further characteristics and advantages of the circuit according to the invention will become clear from the detailed description which follows with reference to the appended drawings, provided by way of non-limiting example, in which.

Figure 1:
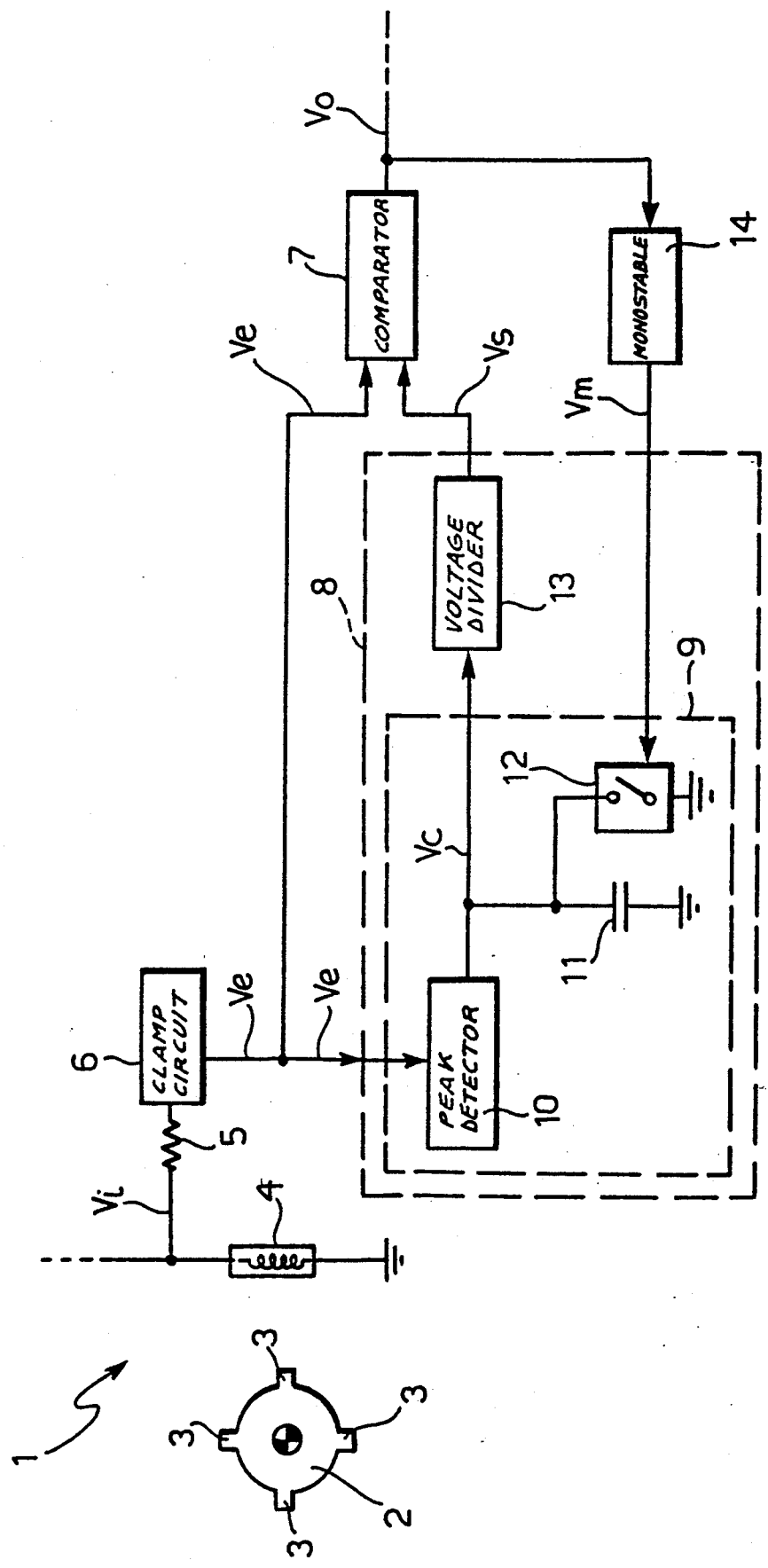
FIG. 1 shows a circuit according to the invention.

In FIG. 1, a variable-reluctance rotation sensor is generally indicated 1 and comprises a rotor 2 having a plurality of teeth 3 in suitably-selected angular positions. An inductive pick-up, indicated 4, is associated with the rotor 2.

When the rotor 2 is rotated, each time one of its teeth 3 passes in front of the pick-up 4, the latter outputs a voltage signal with an amplitude which is initially positive and subsequently becomes negative, after passing through zero.

Figure 2:
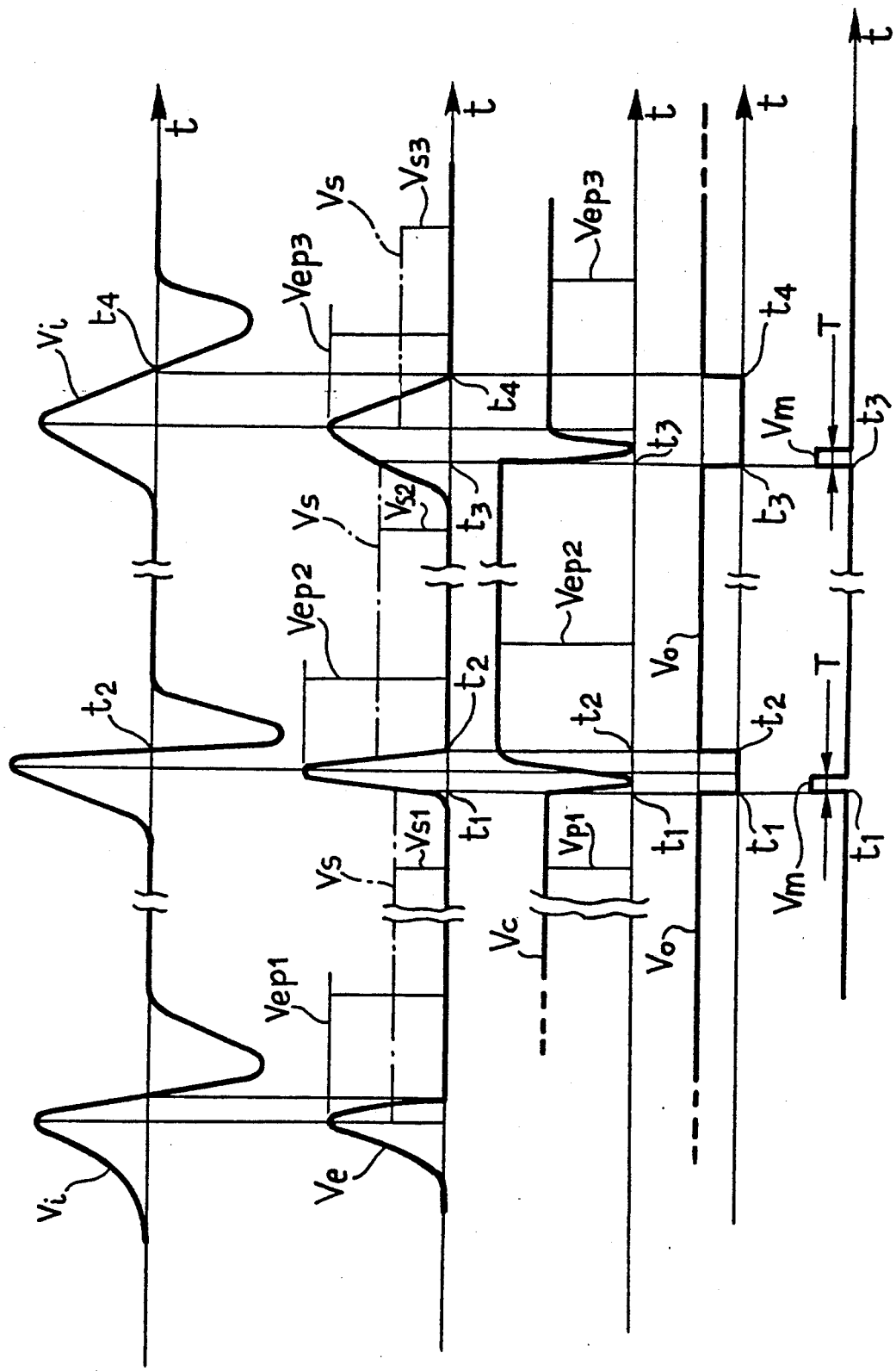
FIG. 2 is a series of graphs showing the changes in the signal provided by a variable-reluctance rotation sensor and the corresponding signals generated in the circuit according to the invention as functions of time given on the abscissa.

In FIG. 2, $V_i$ indicates an example of the changes in the signal output by the inductive pick-up 4, with reference to the passage of three teeth of the rotor 2 in front of the pick-up, as a function of time t.

The output of the inductive pick-up 4 is connected through a resistor 5 to the input of a clamp circuit 6, formed in a known manner, which "cuts off" the negative portions of the signal $V_i$ and compresses the dynamic range of the signal. The output of the clamp circuit is connected to a first input of a threshold comparator 7 with hysteresis and to the input of a threshold-signal generator circuit, generally indicated 8. The output of the latter circuit is connected to the input of the threshold comparator 7.

The threshold-signal generator circuit includes a sampling and storage circuit generally indicated 9, including a peak-detector 10 whose input is connected to the output of the clamp circuit 6. A storage capacitor 11 is situated between the output of the peak detector 10 and earth and a switching device 12 is connected in parallel therewith.

A voltage divider, indicated 13, is interposed between the output of the sampling and storage circuit 9 and the threshold comparator 7.

The output of the comparator is connected to the control input of a monostable cicuit 14 whose output controls the switching device 12 arranged in parallel with the storage capacitor 11.

When the clamping circuit 6 receives the input signal $V_i$ of FIG. 2, it outputs, correspondingly, a signal $V_e$ which has a peak in correspondence with each of the positive peaks of the signal $V_i$. In FIG. 2, the amplitudes of the three illustrated peaks of the signal $V_e$ are indicated $V_{ep1}$, $V_{ep2}$ and $V_{ep3}$.

When the signal $V_e$ applied to the peak detector 10 has a peak of amplitude $V_{ep1}$, the voltage across the capacitor 11 is brought to, and remains (as long as the switch 12 is kept in the non-conductive condition) at the level $V_{ep1}$, as indicated by the wave form $V_c$ in FIG. 2. The voltage $V_c$ is applied to the input of the voltage divider which reduces it, for example by dividing it by 2. The voltage divider therefore applies a threshold voltage $V_s$ to the comparator 7 the trace of which is indicated in chain line in FIG. 2. Thus, as long as $V_c$ remains at the level $V_{ep1}$, the threshold signal $V_s$ assumes the value indicated $V_{s1}$ in FIG. 2.

As soon as the signal $V_e$ applied to the comparator 7 exceeds the threshold signal $V_s$, as indicated at the time $t_1$ in FIG. 2, the signal $V_0$ output by the comparator 7 changes level, for example from a high level to a low level. This signal activates the monostable circuit 14 which switches the switch 12 to the conductive condition for a predetermined period of time T, for example 5-10 us. The capacitor 11 consequently discharges extremely rapidly through the switch 12 during this time interval, as shown in FIG. 2. When the characteristic time period T of the monostable circuit 14 has elapsed, the switch 12 returns to non-conductive condition and the capacitor 11 is charged to the new peak voltage $V_{ep2}$ of the signal $V_e$. The threshold signal $V_s$ is brought correspondingly rapidly to the value indicate $V_{S2}$ in FIG. 2.

As soon as the signal $V_i$ output by the sensor passes through zero, at the instant indicated $t_2$ in FIG. 2, the output of the comparator 7 returns to the high level again, as shown in the Figure.

When the signal $V_e$ again exceeds the value of the threshold signal $V_{s2}$ (at the time indicated $t_3$ in FIG. 2) the output of the comparator 7 returns to the low level, again activating the monostable circuit 14 as indicated by the wave form $V_m$ in FIG. 2 and switching the switch 12 to the closed condition for the time period T characteristic of the monostable circuit. The capacitor 11 is again discharged almost instantaneously and then starts to charge again as soon as the signal of the monostable circuit 14 has disappeared. The voltage in the capacitor then returns to the new peak value $V_{ep3}$ of the signal $V_e$ and the threshold signal is brought correspondingly to the level $V_{s3}$.

The output of the comparator 7 returns to the high level at the moment $t_4$ at which the signal $V_i$ passes through zero again.

The operation of the circuit then continues in the manner described above.

What is claimed is:

1. A circuit for processing a signal generated by a variable-reluctance electromagnetic rotation sensor to provide a signal the sign of whose amplitude can change, in particular from positive to negative, passing through zero; the circuit comprising:

a threshold-signal generator circuit, a threshold-comparator circuit with hysteresis which is connected to the sensor and to the threshold-signal generator circuit, and which outputs a signal which changes from a first level to a second level when the signal generated by the sensor exceeds a threshold signal, and which changes from the second level to the first level when the signal generated by the sensor passes through zero, the threshold-signal generator circuit comprising a peak-detector circuit which is connected to the sensor, storage means connected to an output of the peak-detector circuit and to a threshold-signal input of the comparator, and reset circuit means for resetting the storage means which are controlled by said signal output of the threshold-comparator circuit so as to zero the storage means almost instantaneously each time the signal provided by the sensor exceeds the threshold signal.

2. A circuit according to claim 1, wherein the storage means comprise a capacitor and the reset circuit means include a switch connected to the capacitor and controlled by a monostable circuit controlled by the output of the threshold-comparator circuit.

3. A circuit according to claim 1 or claim 2, further including a clamp circuit which is interposed between the sensor and inputs of the peak detector and the threshold-comparator circuit, said clamp circuit being adapted to remove one of a negative portion and a positive portion of the signal of the sensor and to compress a dynamic range of the signal.

* * * * *